US008620164B2

(12) United States Patent (10) Patent No.: US 8,620,164 B2
Heck et al. (45) Date of Patent: Dec. 31, 2013

(54) HYBRID III-V SILICON LASER FORMED BY DIRECT BONDING

(75) Inventors: John Heck, Berkeley, CA (US); Hanan Bar, Mevaseret Zion, IL (US); Richard Jones, San Mateo, CA (US); Hyundai Park, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 379 days.

(21) Appl. No.: 13/010,232

(22) Filed: Jan. 20, 2011

(65) Prior Publication Data

US 2012/0189317 A1 Jul. 26, 2012

(51) Int. Cl.
*H04B 10/00* (2013.01)

(52) U.S. Cl.
USPC ........... 398/140; 398/182; 398/201; 398/202; 398/212; 372/39; 372/43.01; 372/45.01; 385/14

(58) Field of Classification Search
None
See application file for complete search history.

(56) References Cited

U.S. PATENT DOCUMENTS

| | | | | |
|---|---|---|---|---|
| 6,400,742 B1 * | 6/2002 | Hatakoshi et al. | ......... | 372/46.01 |
| 7,257,283 B1 * | 8/2007 | Liu et al. | .......................... | 385/14 |
| 2006/0054899 A1 * | 3/2006 | Takahashi et al. | ............... | 257/80 |
| 2008/0002929 A1 * | 1/2008 | Bowers et al. | ................... | 385/15 |
| 2008/0198888 A1 | 8/2008 | Arimoto | | |
| 2009/0245298 A1 | 10/2009 | Sysak et al. | | |
| 2009/0245316 A1 | 10/2009 | Sysak et al. | | |
| 2009/0274411 A1 * | 11/2009 | Bar et al. | ......................... | 385/14 |

OTHER PUBLICATIONS

Roelkens et al: "III-V/silicon photonics for on-chip and inter-chip optical interconnects", Laser Photonics Rev., 4, No. 6, 2010, pp. 751-779.*
Bowers, John E. et al., "Hybrid III-V and IV Lasers and Amplifiers", European Conference on Optical Communications (ECOC) 2007; Paper 9.2.1 (Invited), Sep. 20, 2007, 4 pages.
Stankovic, S. et al., "Evanescently-Coupled Hybrid III-V/Silicon Laser Based on DVS-BCB Bonding", Proceedings Symposium IEEE Photonics Benelux Chapter, 2010, Delft,the Netherlands pp. 77-80 (4 pages).
Int'l Search Report and Written Opinion mailed Sep. 26, 2012 for Int'l Patent Application No. PCT/IB2012/000518.
Bowers, J. et al., "Hybrid Silicon Lasers: The Final Frontier to Integrated Computing" Optics & Photonics News, May 2010, pp. 28-33.
Roelkens, G. et al., " III-V/silicon photonics for on-chip and inter-chip optical interconnects" Laser & Photonics Review, Rev. Jan. 14, 2010, pp. 1-29.
Notification Concerning Transmittal of International Preliminary Report on Patentability (Chapter I of the Patent Cooperation Treaty) issued for International Application No. PCT/IB2012/000518, mailed Aug. 1, 2013.

* cited by examiner

*Primary Examiner* — Li Liu
(74) *Attorney, Agent, or Firm* — Blakely, Sokoloff, Taylor & Zafman LLP

(57) ABSTRACT

Described herein is a hybrid III-V Silicon laser comprising a first semiconductor region including layers of semiconductor materials from group III, group IV, or group V semiconductor to form an active region; and a second semiconductor region having a silicon waveguide and bonded to the first semiconductor region via direct bonding at room temperature of a layer of the first semiconductor region to a layer of the second semiconductor region.

18 Claims, 7 Drawing Sheets

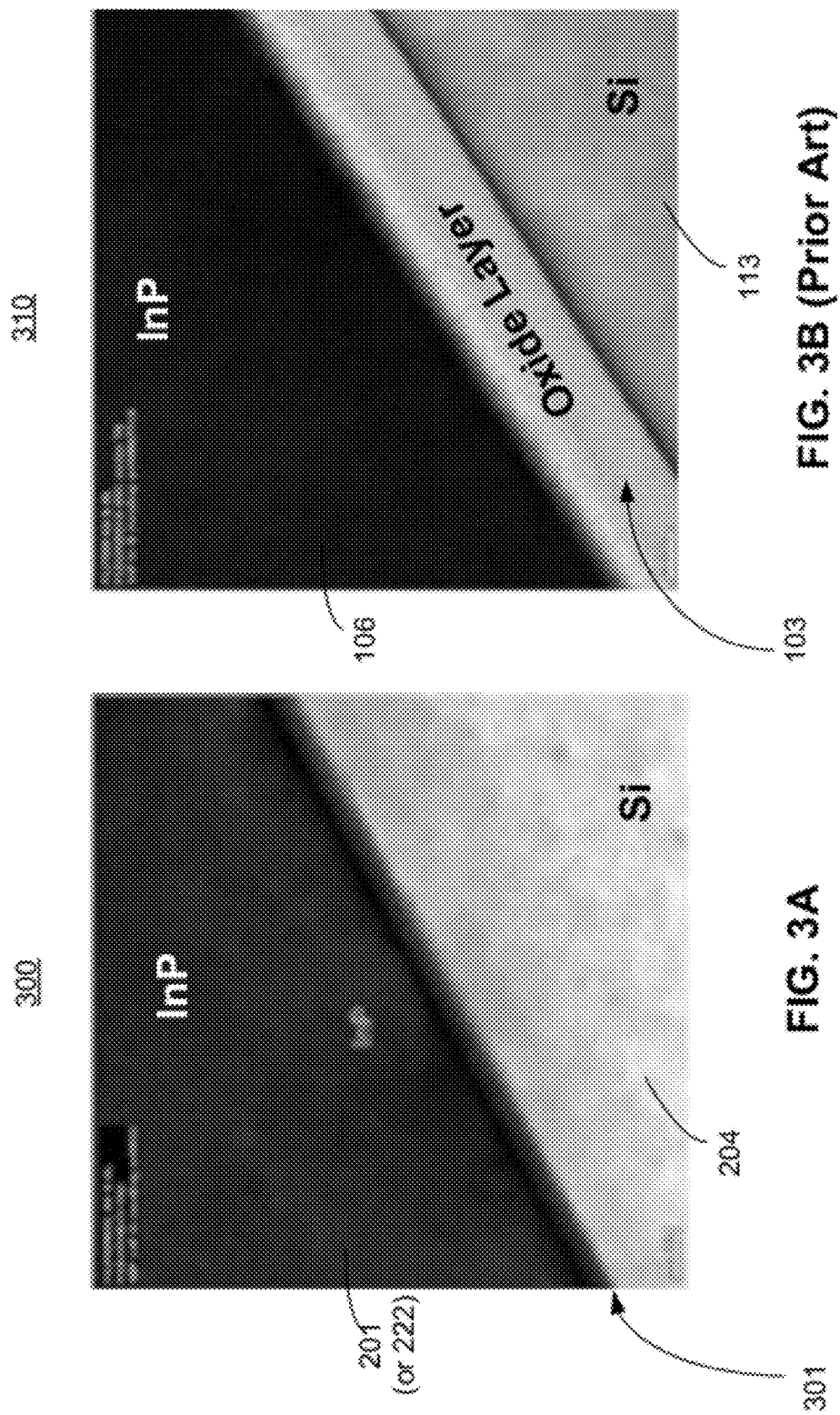

HYBRID III-V SILICON LASER FORMED BY DIRECT BONDING

FIELD OF THE INVENTION

Embodiments of the invention relate generally to the field of lasers. More particularly, embodiments of the invention relate to an apparatus of a hybrid III-V silicon laser formed by a method of direct bonding of an III-V active region with a silicon region, and a system of using the hybrid III-V silicon laser formed by the method of direct bonding.

BACKGROUND

Semiconductor lasers are generally made from light-emitting properties of III-V semiconductor materials. The term "III-V" herein refers to elements from group III to group V of the periodic table. Typical semiconductor lasers are composed of two components, an III-V active region to generate light and a silicon waveguide to carry the generated light. The two components are combined together by molecular $O_2$ plasma-assisted wafer bonding procedure or alternatively by means of an adhesive die-to-wafer binding technique that applies benzocyclobutene (BCB) adhesive between the III-V active region and the silicon waveguide.

The molecular $O_2$ plasma-assisted wafer bonding procedure is a hydrophilic bonding process that applies a thin oxide layer between the two components. The hydrophilic bonding process requires completely clean, smooth, and contamination-free bonding surfaces which are difficult to meet for high volume manufacturing. In the hydrophilic bonding process, the two components are combined to form a hybrid III-V silicon laser by annealing the two components at high temperature e.g., 300° C., for 40-60 minutes to form an intermediate-strength bond between the layer of the III-V active region and the silicon substrate. The process of annealing also requires channels to be made in the silicon component to diffuse hydrogen formed by the process of annealing. Any surface roughness or contamination between the bonding surfaces results in large unbounded areas causing the intermediate-strength bond. The alternative approach of using BCB adhesive between the III-V active region and the silicon region requires an additional fabrication process of applying the adhesive which changes the distance between the silicon waveguide and a multiple quantum well region of the III-V active region, thus impacting the performance of the hybrid III-V silicon laser.

FIG. 1A illustrates a cross-section of such prior art hybrid III-V silicon laser 100 in which the III-V active region 101 is bonded to the silicon region 102 at high temperature via a layer of oxide 103. The III-V active region 101 is formed from layers of III-V semiconductor materials 110 which do not include metal contacts 107 and 108. The III-V active region 101 generates the current that flows from the positive contact 108 towards the negative contact 107 when a potential difference is applied across the positive contact 108 and the negative contact 107. The current generated in the active region 101 further generates light which is channeled through a silicon waveguide 105. The waveguide 105 is confined to its position by regions 109 on either side of the waveguide 105. The light generated by the current forms a laser beam which can be used for optical communication.

The plasma activation process uses a thin oxide layer 103 between an Indium Phosphide (InP) layer 106 of the active region 101 and silicon layer 102. The silicon region 102 of FIG. 1A is a silicon-on-insulator (SOI) having a buried oxide layer 111 between a silicon substrate 112 and a silicon interface layer 113. The plasma activation process forms hydrogen bonds between water molecules. To complete the hydrogen bonds, the annealing process generates hydrogen molecules which diffuse either to the edge of the bonded surface or to vertical channels 104 connected to the buried oxide layer 111 which absorbs the hydrogen molecules.

The annealing process causes stress to the two regions 101 and 102. Furthermore, the vertical trenches 104 for channeling the hydrogen molecules require an additional process mask. Moreover, the oxide layer 103 for bonding the two regions 101 and 102 is an additional process fabrication step. The plasma activation and BCB processes add to the overall cost of fabricating high volume hybrid III-V silicon lasers.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 3A illustrates a Transmission Electron Microscopy (TEM) image of a cross-section of a hybrid III-V silicon laser in which the III-V active region is bonded to the silicon region at room temperature by direct bonding, according to one embodiment of the invention.

FIG. 3B illustrates a TEM image of a cross-section of the prior art hybrid III-V silicon laser in which the prior art III-V active region is bonded to the silicon region at high temperature via a layer of oxide.

DETAILED DESCRIPTION

Embodiments of the invention describe an apparatus of a hybrid III-V silicon laser formed by a method of direct bonding of an III-V active region with a silicon region, and a system of using the hybrid III-V silicon laser formed by the method of direct bonding.

In one embodiment, the direct bonding described herein occurs at room temperature thus eliminating the process of annealing. In one embodiment, the room temperature is from a range of 65 Fahrenheit (F) to 85 F. In one embodiment, the direct bonding is spontaneous and does not require waiting for 45-60 minutes as is the case for the annealing process of forming the prior art hybrid III-V silicon laser of FIG. 1A. In the embodiments discussed herein, the spontaneous bonding saves time and money for high volume fabrication of the hybrid III-V silicon lasers. Furthermore, adhesives that can sustain high temperatures of the annealing process are not needed because the annealing process is eliminated in the present embodiments.

In one embodiment, the vertical channels (104 of FIG. 1A) are also eliminated because hydrogen molecules are not formed in the absence of the process of annealing, thus simplifying the fabrication process of forming a hybrid III-V silicon laser. In one embodiment, the direct bonded III-V active region and the silicon region results in a conductive layer between the III-V active region and the silicon region which provides additional conductive path for the current generated by the III-V active region. In one embodiment, the direct bond between the III-V active region and the silicon region is twice as strong as the bond formed between the III-V active region 101 and the silicon region 102 of the prior art hybrid III-V silicon laser of FIG. 1A.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention. For example, the height/depth of each layer forming the III-V active region is not described herein. Furthermore, the embodiments of the invention are not limited to a particular composition of the III-V active region as long as the composition of the III-V active region allows for direct bonding with the silicon region as discussed in the embodiments.

Figure 2A:
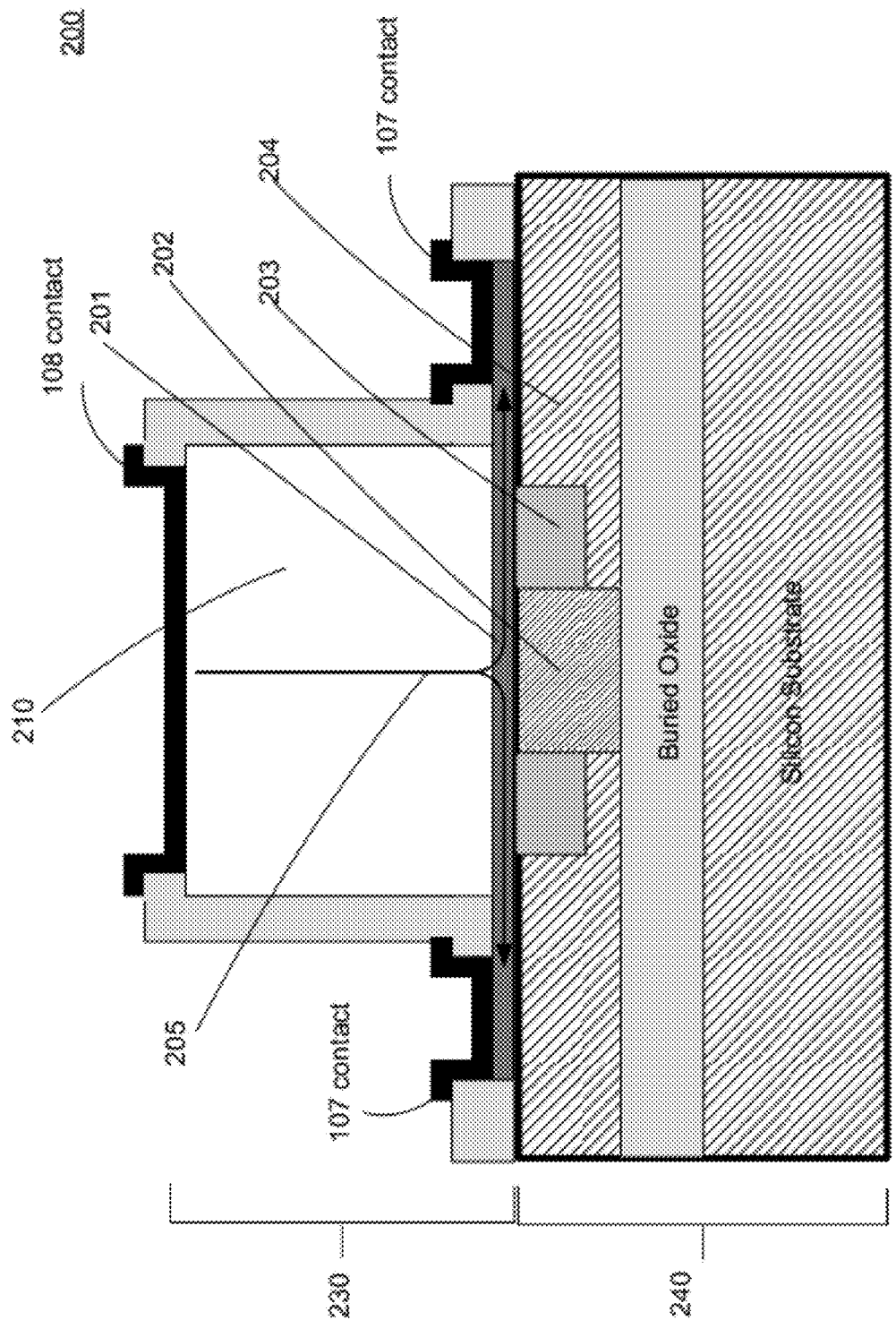
FIG. 2A illustrates a cross-section of a hybrid III-V silicon laser in which the III-V active region is bonded to the silicon region at room temperature by direct bonding, according to one embodiment of the invention.

FIG. 2A illustrates a cross-section of a hybrid III-V silicon laser 200 in which the III-V active region 230 (also referred to as the first semiconductor region) is bonded to the silicon region 240 (also referred to as the second semiconductor region) at room temperature by direct bonding, according to one embodiment of the invention. In one embodiment, the process of direct bonding occurs at room temperature between layers 201 and 204 of the first and second semiconductor regions respectively. In one embodiment, the process of direct bonding occurs in a vacuum between layers 201 and 204 of the first and second semiconductor regions respectively to avoid contamination of the bonding surfaces.

As mentioned above, the room temperature is from a range of 65 Fahrenheit (F) to 85 F which results in no thermal expansion of the bonding surfaces, thus improving reliability of the hybrid III-V silicon laser structure 200. In one embodiment, the layer 201 of the first semiconductor region is composed of Indium Phosphide (InP) while the layer 204 of the second semiconductor region is composed of silicon (Si), wherein a surface of the layer of InP 201 is directly bonded to a surface of the layer of Si 204 via covalent bonding (at room temperature) of the surfaces of the layers of InP 201 and Si 204.

In one embodiment, the III-V active region 230, including region 210, comprises layers of semiconductor material from group III, group IV, or group V. The layers of the III-V active region 230, including region 210, are shown in FIG. 1B, according to one embodiment of the invention. In one embodiment, the electrical contacts 107 and 108 are metal contacts and are not part of the III-V active region 230 but are coupled to the III-V active region 230 to provide electric current to the III-V active region 230.

FIG. 1B illustrates a cross-section of a III-V active region 120, according to one embodiment of the invention. In one embodiment an electrical metal contact 108 couples to a layer 121. In one embodiment, the layer 121 is an ohmic contact layer. In one embodiment, the ohmic contact layer 121 is composed from p-doping type material InGaAs (Indium Gallium Arsenide). In one embodiment, the layer 121 couples to a cladding layer 122. In one embodiment, the cladding layer 122 is composed from p-doping type material InP (Indium Phosphide). In one embodiment, the cladding layer 122 couples to a separated confinement hetero-structure (SCH) layer 123. In one embodiment, the layer 123 is composed from p-doping type material AlGaInAs (Aluminum Gallium Indium Arsenide). In one embodiment, the layer 123 couples to a carrier blocking layer 124. In one embodiment the layer 123 is also composed of AlGaInAs.

In one embodiment, the layer 124 couples to a multiple quantum well (MQW) layer 125. In one embodiment, the MQW layer 125 is composed from AlGaInAs. In one embodiment, the MQW layer couples to the layer 126 composed of n-doping type material InP (Indium Phosphide). The layers discussed above may have slight differences in their atomic ratios to tune the exact bandgap, according to one embodiment of the invention. In one embodiment, the InP layer 126 extends laterally on either side of the active region 230 (see dotted extension of layer 126) to connect with the electrical metal contact 107 as shown by layer 201 of FIG. 2A.

Figure 1B:
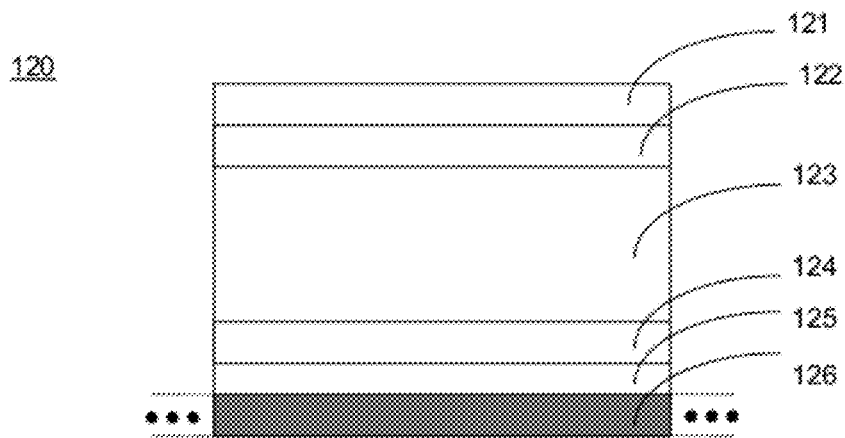
FIG. 1B illustrates a cross-section of a III-V active region, according to one embodiment of the invention.
Figure 2B:
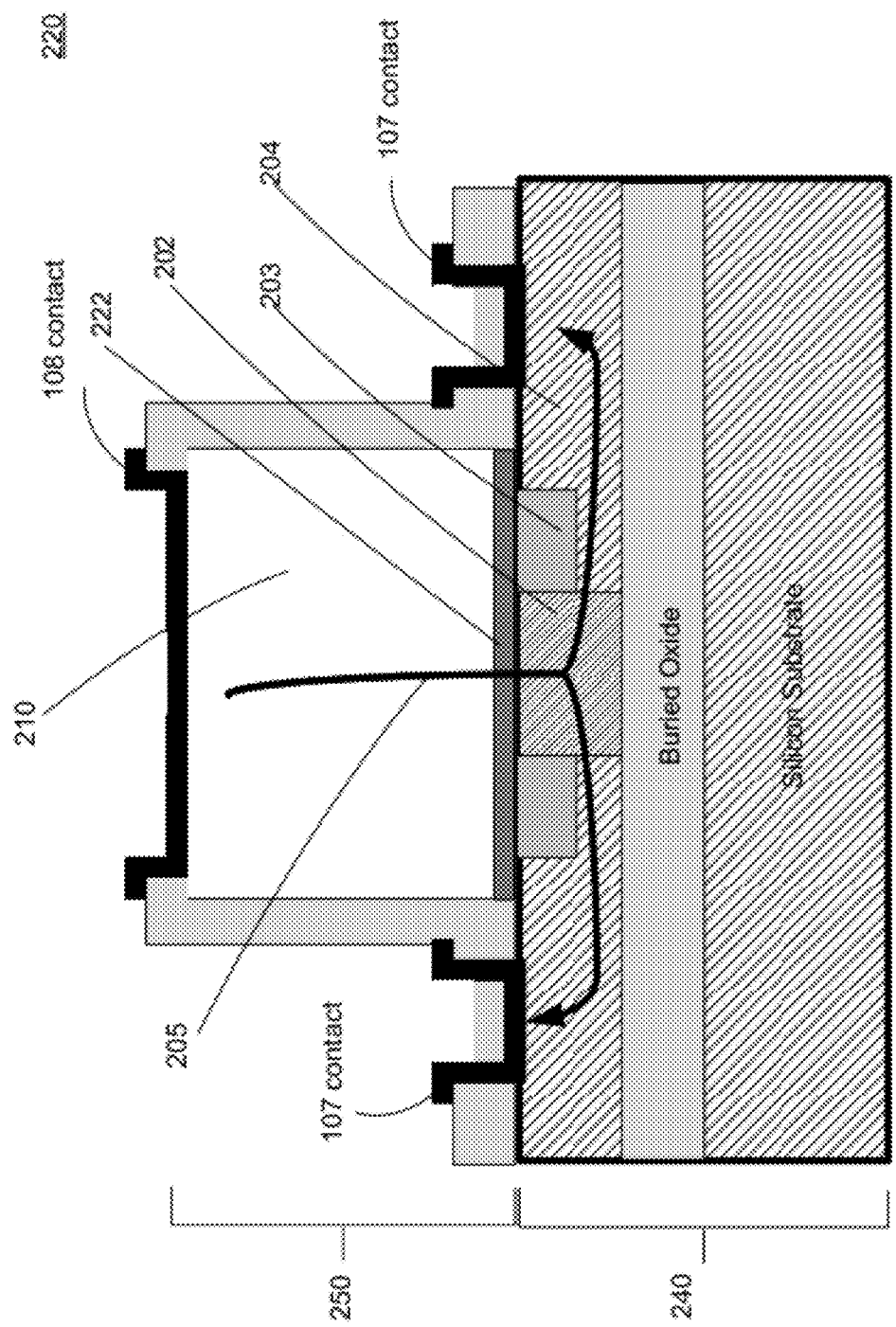
FIG. 2B illustrates a cross-section of a hybrid III-V silicon laser in which the III-V active region is bonded to the silicon region at room temperature by direct bonding, according to another embodiment of the invention.

Referring back to FIG. 1B, in one embodiment the InP layer 126 does not extend laterally on either side of the region 210 to connect with the electrical contact 107 as shown by layer 222 of FIG. 2B. In such an embodiment the silicon layer 204, to which the InP layer 222 is directly bonded, provides a path of electric current to the contacts 107. In one embodiment, the silicon region 240 is a SOI region.

Referring back to FIG. 2A, in one embodiment the bonding surfaces of the III-V active region 230 and the SOI region 240 are cleaned prior to direct bonding of the two regions 230 and 240. In one embodiment, a cleaning process is applied to the surface of layer InP 201 and the surface of layer Si 204 to remove any oxide and/or organic contaminants from the surface layers of 201 and 204. In one embodiment, the cleaning process comprises an application of an Ar (Argon) ion beam to the surface layers of 201 and 204. In other embodiments, a cleaning process comprising other chemicals may be used to remove any oxide and/or organic contaminants from the surface layers of 201 and 204 so as to enable direct bonding of the layers 201 and 204.

In the embodiments discussed herein, the process of direct bonding of the surfaces of layers 201 and 204 eliminate the need of having vertical trenches to channel hydrogen molecules formed from the process of annealing which is eliminated in these embodiments. The absence of the vertical trenches (104 of FIG. 1A) further eliminates a process fabrication step in forming the hybrid III-V silicon laser 200 thus saving time and money. The absence of the vertical trenches also improves reliability of the hybrid III-V silicon laser 200 because extra voids between bonded layers 201 and 204 are removed. In one embodiment, the process of direct covalent bonding does not require any intermediate adhesive between the bonding surfaces 201 and 204. The absence of any intermediate adhesive in the embodiments described herein reduces the cost of fabricating hybrid III-V silicon lasers and making high volume manufacturing more feasible. In other embodiments, an intermediate temporary adhesive may be used between the surfaces of layers 201 and 204 to temporarily hold the regions 230 and 240 during room temperature.

In one embodiment, an optical waveguide 202 is formed directly under the InP layer 202. In one embodiment, trenches 203 are formed on either side of the optical waveguide 202 to confine light within the waveguide 202. The optical waveguide 202 carries the optical signal in the form of a laser which is generated by applying a voltage potential across the metal contacts 107 and 108. In one embodiment, the potential difference across the metal contacts 107 and 108 is such that a current 205 of 30-150 mA flows from the metal contact 108 to the metal contact 107 via the InP layer 201 to cause the generation of an optical laser in the waveguide 202. In one embodiment, the metal contact 108 is operable to receive a positive voltage potential while the metal contact 107 is operable to receive a negative voltage potential.

FIG. 2B illustrates a cross-section of a hybrid III-V silicon laser 220 in which the III-V active region 250 (also referred to as the first semiconductor region) is bonded to the silicon region 240 (also referred to as the second semiconductor region) at room temperature by direct bonding, according to another embodiment of the invention. In both the embodiments of FIG. 2A and FIG. 2B, there is no oxide layer between the surfaces of InP 201 and Si 204 which reduces the cost of fabrication and provides a conductive path to the metal contacts 107 through the bonding interface. The embodiment of the hybrid III-V silicon laser 220 differs from the embodiment 200 of FIG. 2A in that InP layer 222 of the active region 250 does not extend on either side of the region 210 (which in one embodiment comprises layers 121, 122, 123, 124, 125 of FIG. 1B) to connect with the electrical metal contacts 107.

In such an embodiment, electric current 205 flows through the bonded interface into the silicon layer 204 and out to the metal contacts 107. In one embodiment, such conductive interface enables the silicon layer 204 to act as an electrical contact by itself. Such conductive interface is not available in the hybrid III-V silicon laser 100 of FIG. 1A because the oxide layer 103 acts as an insulator inhibiting transmission of electric current. The embodiment of FIG. 2B further simplifies the fabrication process because the InP layer 222 does not extend under the metal contacts 107.

In one embodiment, the electrical contacts 107 and 108 are metal contacts and are not part of the III-V active region 250 but are coupled to the III-V active region 250 to provide electric current to the III-V active region 250.

FIG. 3A illustrates a Transmission Electron Microscopy (TEM) image 300 of a cross-section of the hybrid III-V silicon laser 200 and/or 220 in which the III-V active region (230 and/or 250) is bonded to the silicon region 240 at room temperature by direct bonding, according to one embodiment of the invention. The TEM image 300 is described with reference to FIG. 1B and FIGS. 2A-B. The TEM image 300 shows a direct bond between the InP layer 201 or 222 and the Si layer 204. The direct bonding interface 301 has no oxide layer between the surfaces of the InP layer 201 or 222 and the Si layer 204. The direct bonding is also performed at room temperature.

Figure 1A:
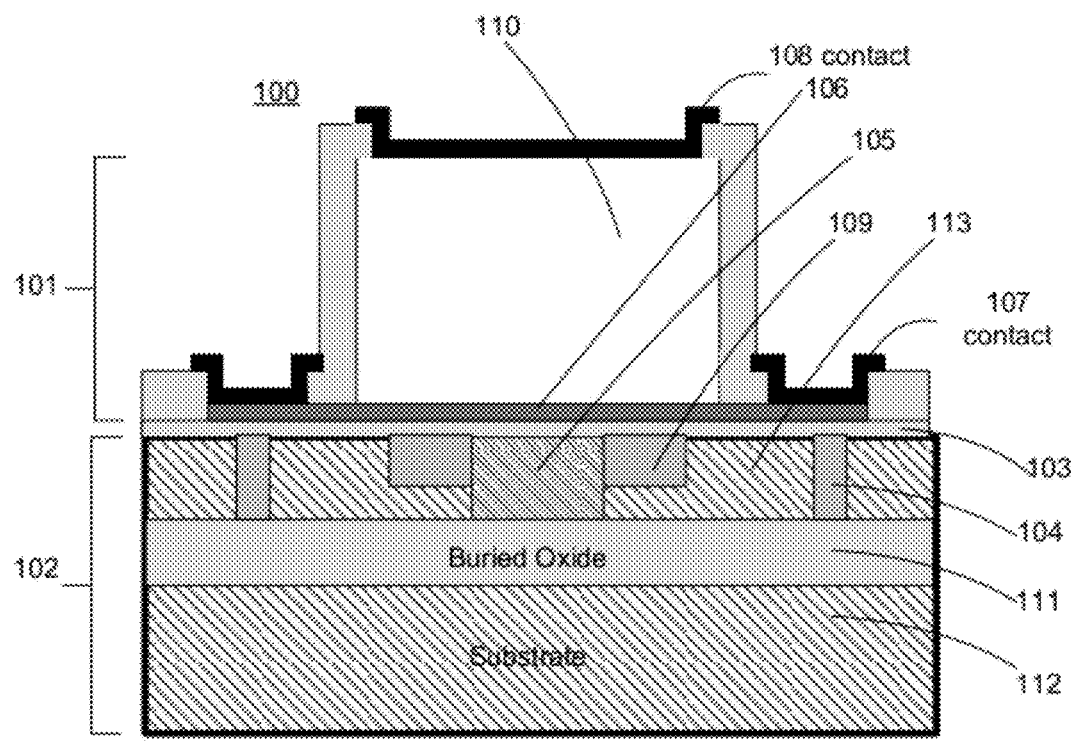
FIG. 1A illustrates a cross-section of a prior art hybrid III-V silicon laser in which the hybrid III-V active region is bonded to the silicon region at high temperature via a layer of oxide.

Conversely, FIG. 3B illustrates a TEM image 310 of a cross-section of the prior art hybrid III-V silicon laser 100 of FIG. 1A in which the InP layer 106 of the III-V active region 101 is bonded to the silicon layer 113 at high temperature with a layer of oxide 103 between the InP layer 106 and the silicon layer 113. As mentioned above, the oxide layer 103 is an insulating layer and an additional fabrication step.

Figure 4:
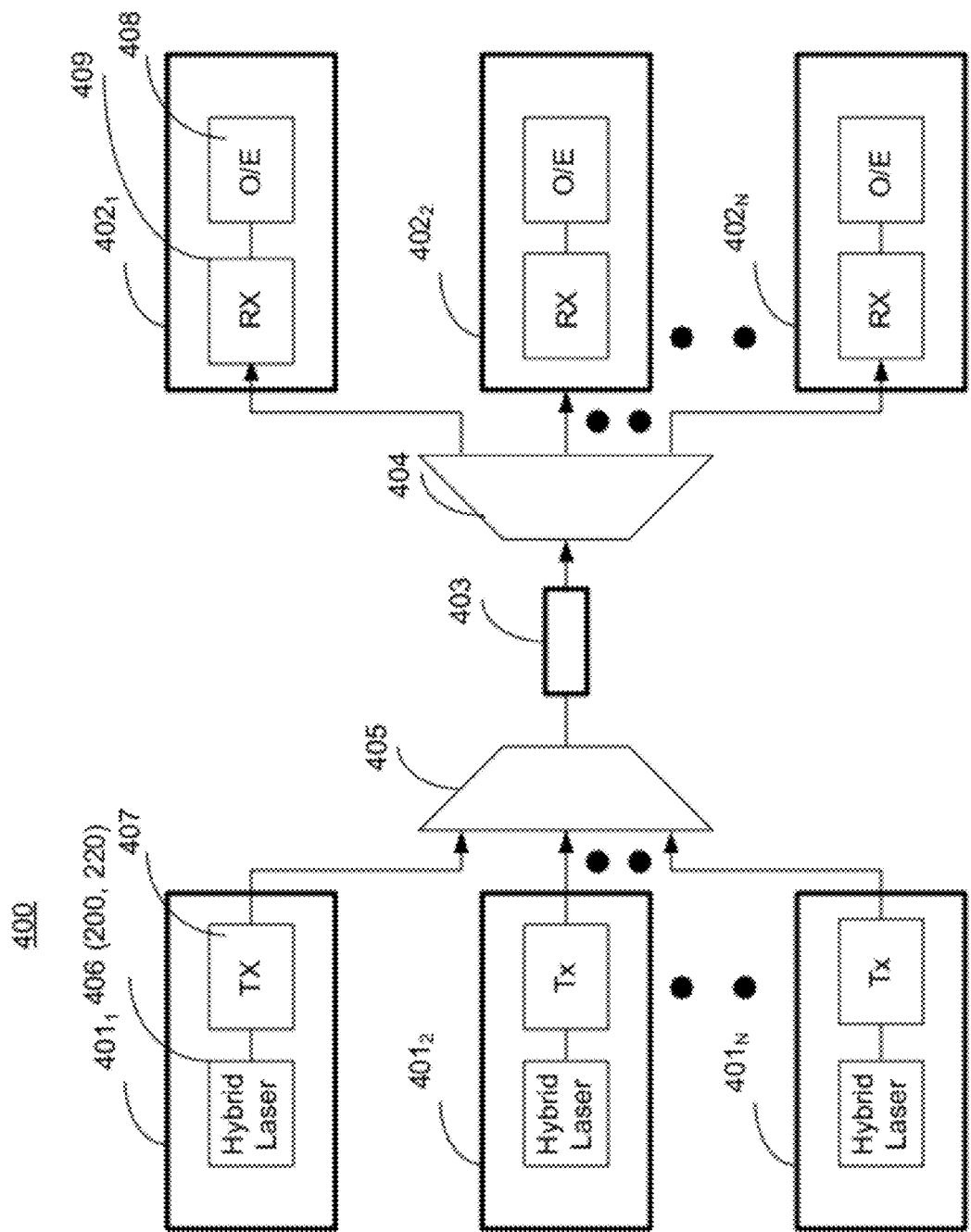
FIG. 4 illustrates an optical system having the hybrid III-V silicon lasers of FIG. 2A-B in the optical transmitters, according to one embodiment of the invention.

FIG. 4 illustrates an optical system 400 having the hybrid III-V silicon laser 200 and 220 of FIGS. 2A-B in an optical transmitter, according to one embodiment of the invention. In one embodiment, the system 400 comprises one or more optical transmitters $401_{1-N}$. Each optical transmitter from the optical transmitters $401_{1-N}$ comprises a hybrid III-V silicon laser unit 406 coupled to a transmitter 407. In one embodiment, the hybrid III-V silicon laser unit 406 is one of the hybrid III-V silicon lasers 200 or 220. In one embodiment, the transmitter 407 transmits an optical signal of different wavelengths via multiplexer 405, optical waveguide 403, and de-multiplexer 404. In one embodiment, the wavelengths range from wavelengths of less than 900 nm or wavelengths from a range of 1260 nm to 1380 nm. In one embodiment, the transmitter 407 comprises a modulator (not shown) that receives the laser generated by the hybrid III-V silicon laser unit 406 (200 or 220) and modulates information on to the laser beam, wherein the modulated beam is then transmitted over the optical waveguide 403 to the optical receiver 402.

In one embodiment, each optical receiver from among the optical receivers $402_{1-N}$ comprises a receiver 409 coupled to an optical to electrical conversion unit 408. In one embodiment, the receiver 409 comprises an array of photo-detectors. In one embodiment, the de-multiplexer 404 couples an optical transmitter from among the optical transmitters $401_{1-N}$ to a corresponding optical receiver from among the optical receivers $402_{1-N}$. In one embodiment, the optical waveguide 403 is an optical Universal Serial Bus (USB) cable. In one embodiment the optical waveguide 403 is an optic fiber cable. In one embodiment, the optical transmitters $401_{1-N}$ and receivers $402_{1-N}$ reside in their respective computer systems (not shown). In one embodiment, the optical transmitters $401_{1-N}$ and receivers $402_{1-N}$ reside on the same processor.

Figure 5:
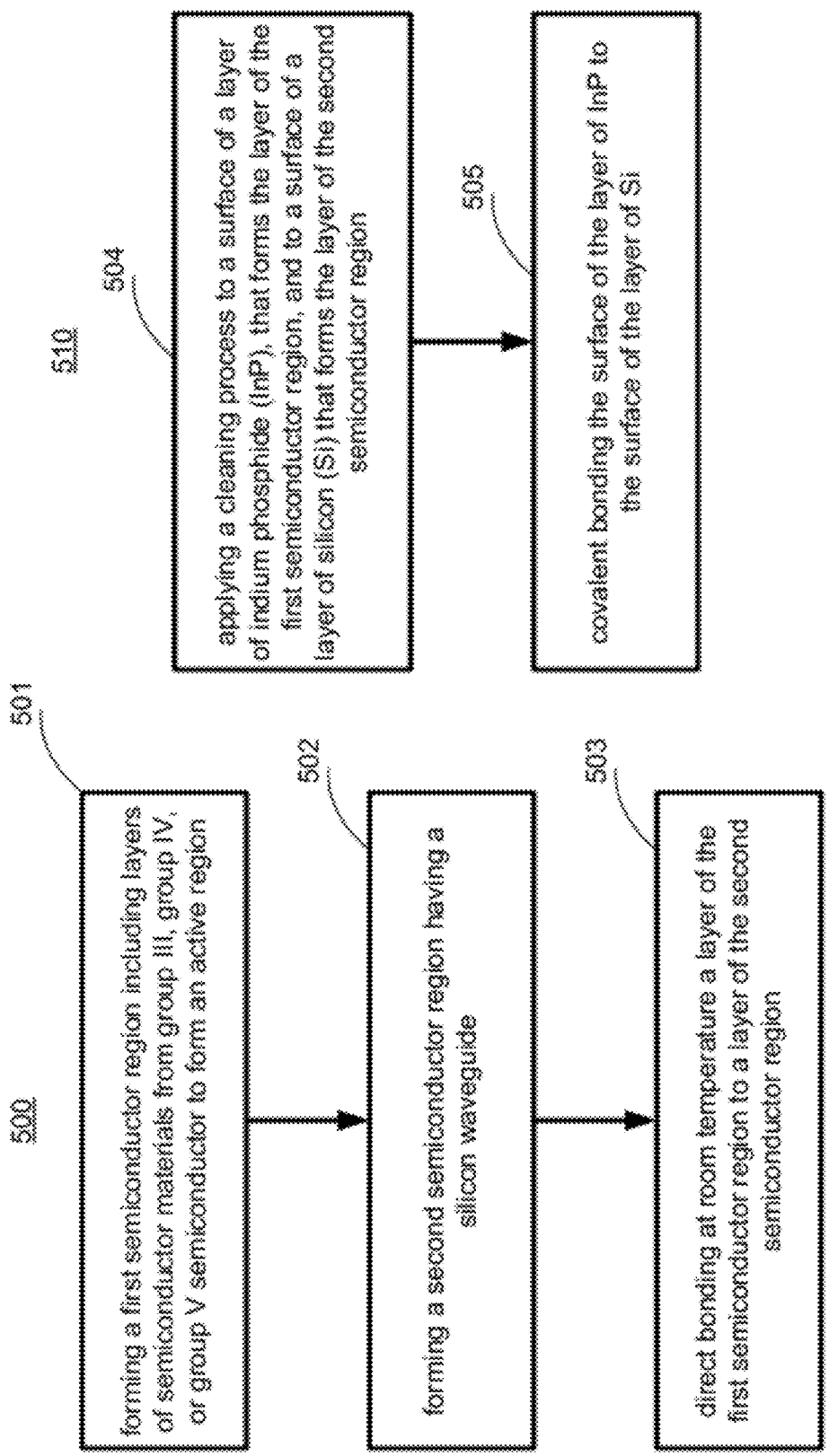
FIG. 5A illustrates a flowchart of a method to form the hybrid III-V silicon laser of FIG. 2A-B, according to one embodiment of the invention.
FIG. 5B illustrates a flowchart of a method for direct bonding of the III-V active region to the silicon region, according to one embodiment of the invention.

FIG. 5A illustrates a flowchart 500 of a method to form the hybrid III-V silicon laser of FIG. 2A-B, according to one embodiment of the invention. At block 501, the III-V region 230 or 250 (first semiconductor region) is formed by combining layers of semiconductor materials from group III, group IV, or group V semiconductor to form an active region. In one embodiment, the layers of the III-V region 230 or 250 are formed according to the layers discussed with reference to FIG. 1B. Referring back to FIG. 5A, at block 502 the silicon region 240 (second semiconductor region) is formed having the silicon waveguide 202. At block 503, the first and second semiconductor regions are bonded by direct bonding at room temperature. In one embodiment, the surface of the layer 201 or 222 of the first semiconductor region 230 or 250 is composed of InP and is bonded to the Si layer 204 of the second semiconductor region 240 by covalent bonding.

FIG. 5B illustrates a flowchart 510 of the method 503 for direct bonding of the III-V active region (230 or 250) to the silicon region 240, according to one embodiment of the invention. At block 504, a cleaning process is performed to the surface of the layer 201 or 222 of InP and to the surface of the layer of Si 204. In one embodiment, the cleaning process applies an Argon (Ar) ion beam to the surfaces of layers InP 201 or 222 and Si 204 to remove oxide and organic material from the surfaces of the layers of InP 201 or 222 and Si 204. At block 505, covalent bonds are formed at room temperature between the surfaces of the layers of InP 201 or 222 and Si 204. In one embodiment, the covalent bonds are formed at room temperature and in a vacuum between the surfaces of the layers of InP 201 or 222 and Si 204.

In one embodiment, the methods of FIG. 5A-B for forming the hybrid III-V silicon laser can be performed by executing machine-readable instructions by a processor, wherein the machine-readable instructions are stored on a machine-readable storage medium (e.g., a flash memory, a dynamic random access memory, a static random access memory, etc.) coupled to the processor.

Figure 6:
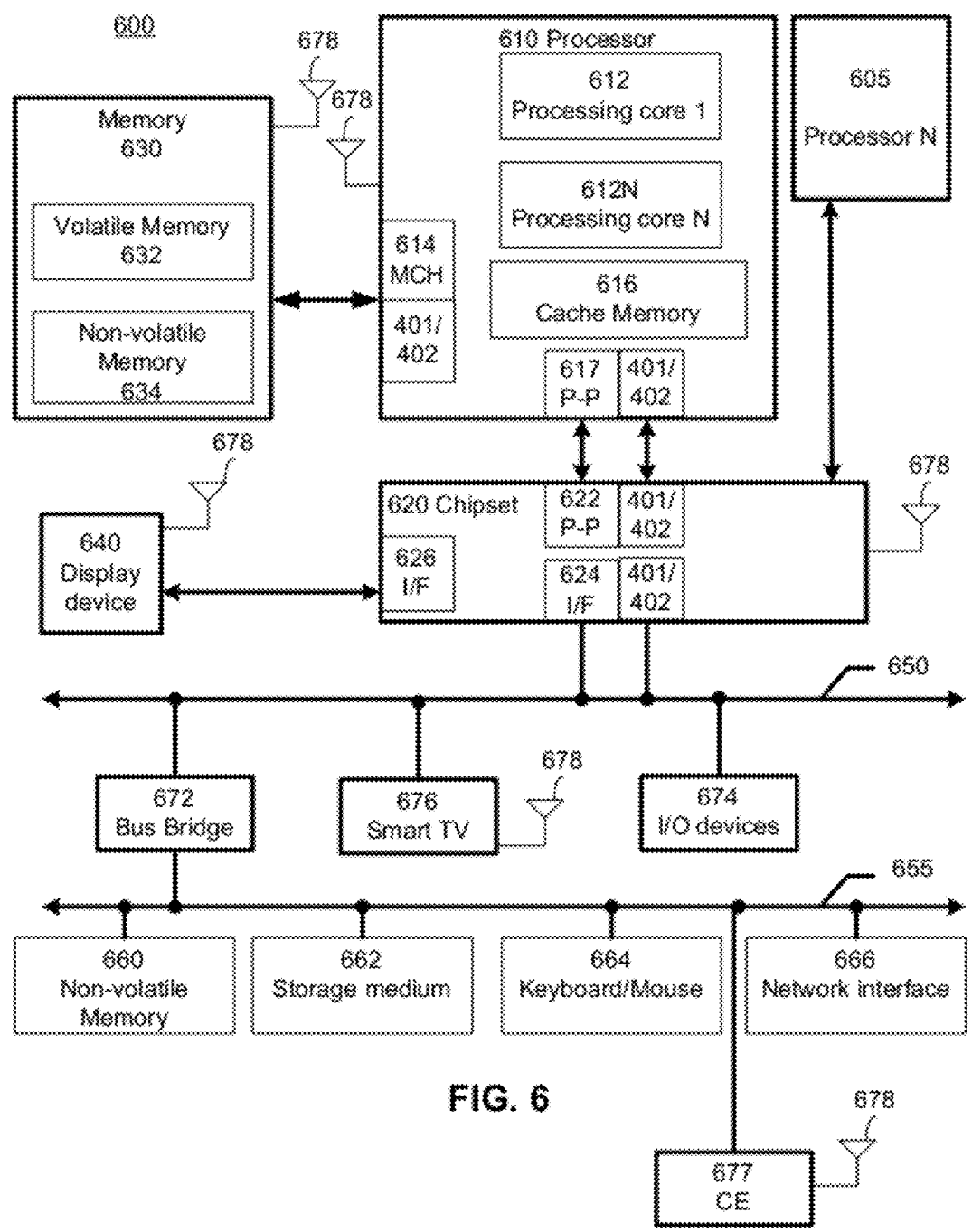
FIG. 6 illustrates a system level diagram having the hybrid III-V silicon lasers of FIG. 2A-B and optical system of FIG. 4, according to one embodiment of the invention.

FIG. 6 illustrates a system level diagram having the hybrid III-V silicon lasers of FIG. 2A-B and the optical system of FIG. 4, according to one embodiment of the invention. In one embodiment, the system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 600 implements the methods disclosed herein and may be a system on a chip (SOC) system.

In one embodiment, the processor 610 has one or more processing cores 612 and 613N, where 613N represents the Nth processor core inside the processor 610 where N is a positive integer. In one embodiment, the system 600 includes multiple processors including 610 and 605, where processor 605 has logic similar or identical to logic of processor 610. In one embodiment, the processing core 612 includes, but is not limited to, pre-fetch logic to fetch instructions, decode logic to decode the instructions, execution logic to execute instructions and the like. In one embodiment, the processor 610 has a cache memory 616 to cache instructions and/or data of the system 600. In one embodiment, the cache memory stores the instructions to execute the methods of FIG. 5A-B. In another embodiment of the invention, the cache memory 616 includes level one, level two and level three, cache memory, or any other configuration of the cache memory within the processor 610.

In one embodiment, processor 610 includes a memory control hub (MCH) 614, which is operable to perform functions that enable the processor 610 to access and communicate with a memory 630 that includes a volatile memory 632 and/or a non-volatile memory 634. In one embodiment, the processor 610 includes a transmitter 401 and receiver 402 of FIG. 4 having the hybrid III-V silicon laser of FIG. 2A and/or FIG. 2B. In one embodiment, the processor 610 uses the transmitter 401 and receiver 402 of FIG. 4 to communicate with the memory 630 and a chipset 620. In one embodiment, the processor 610 is also coupled to a wireless antenna 678 to communicate with any device configured to transmit and/or receive wireless signals.

In one embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In one embodiment, memory 630 may also store temporary variables or other intermediate information while the processor 610 is executing instructions. In one embodiment, chipset 620 connects with processor 610 via Point-to-Point (PtP or P-P) interfaces 617 and 622. In one embodiment, chipset 620 enables processor 610 to connect to other modules in the system 600. In one embodiment of the invention, interfaces 617 and 622 operate in accordance with a PtP communication protocol such as the Intel® QuickPath Interconnect (QPI) or the like.

In one embodiment, the processor 610 includes a transmitter 401 and receiver 402 of FIG. 4 having the hybrid III-V silicon laser of FIG. 2A and/or FIG. 2B. In one embodiment, the chipset 620 uses the transmitter 401 and receiver 402 of FIG. 4 to communicate with the processor 610, 605N, display device 640, and other devices 672, 676, 674, 660, 662, 664, 666, 677, etc. In one embodiment, the chipset 620 is also coupled to a wireless antenna 678 to communicate with any device configured to transmit and/or receive wireless signals.

In one embodiment, chipset 620 connects to a display device 640 via an interface 626. In one embodiment, the display 640 includes, but is not limited to, liquid crystal display (LCD), plasma, cathode ray tube (CRT) display, or any other form of visual display device. In one embodiment of the invention, processor 610 and chipset 620 are merged into a single SOC. In addition, the chipset 620 connects to one or more buses 650 and 655 that interconnect various modules 674, 660, 662, 664, and 666. In one embodiment, buses 650 and 655 may be interconnected together via a bus bridge 672 if there is a mismatch in bus speed or communication protocol. In one embodiment, chipset 620 couples with, but is not limited to, a non-volatile memory 660, a mass storage device(s) 662, a keyboard/mouse 664, and a network interface 666 via interface 624 and/or 401/402, smart TV 676, consumer electronics 677, etc.

In one embodiment, the mass storage device 662 includes, but is not limited to, a solid state drive, a hard disk drive, an universal serial bus flash memory drive, or any other form of computer data storage medium. In one embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although the cache memory 616 is depicted as a separate block within the processor 610, the cache memory 616 can be incorporated into the processor core 612 respectively. In one embodiment, the system 600 may include more than one processor/processing core in another embodiment of the invention.

Reference in the specification to "an embodiment," "embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. The embodiments of the invention are intended to embrace all such alternatives, modifications, and variations as to fall within the broad scope of the appended claims.

We claim:

1. An apparatus comprising:
a first semiconductor region including layers of semiconductor materials from group III, group IV, or group V semiconductor to form an active region;
a second semiconductor region having a silicon waveguide and bonded to the first semiconductor region via direct bonding of a layer of the first semiconductor region to a layer of the second semiconductor region, wherein the layer of the first semiconductor region is composed of indium phosphide (InP), wherein the layer of the second semiconductor region is composed of silicon (Si), and wherein a surface of the layer of InP is directly bonded to a surface of the layer of Si;
a first electrical contact coupled to the active region of the first semiconductor region; and
a pair of second electrical contacts, coupled to the Si layer, of the second semiconductor region, wherein electric current flows from the first electrical contact to the pair of second electrical contacts through the Si layer, and wherein the layer of InP extends within a length of the active region.

2. The apparatus of claim 1, wherein the direct bonding between the layers of the first and second semiconductor regions is formed at room temperature in a vacuum.

3. The apparatus of claim 1, wherein a surface of the layer of InP is directly bonded to a surface of the layer of Si via covalent bonding of the surfaces of the layers of InP and Si.

4. The apparatus of claim 1,
wherein each of the second electrical contact is on either side of the active region.

5. The apparatus of claim 1, wherein the silicon waveguide is configured to carry light generated from the active region of the first semiconductor region.

6. The apparatus of claim 1, wherein the semiconductor material layers of the first semiconductor region comprises:
an ohmic contact layer coupled to a first electrical contact layer;
a cladding layer coupled to the ohmic contact layer;
a separated confinement hetero-structure (SCH) layer coupled to the cladding layer;
a carrier blocking layer coupled to the SCH layer;
a multiple quantum well (MQW) layer coupled to the SCH layer; and
an indium phosphide (InP) layer coupled to the MQW layer, wherein a surface of the InP layer is connected to a surface of a layer of the second semiconductor region via direct bonding.

7. The apparatus of claim 1, wherein the second semiconductor region comprises a silicon-on-insulator (SOI) region.

8. The apparatus of claim 1, wherein the first and second semiconductor regions are devoid of any oxide layer between the layers of the first and second semiconductor regions that form a direct bond.

9. A system comprising:
a receiver to receive an optical signal; and
a transmitter to transmit the optical signal to the receiver over an optical waveguide, the transmitter comprising:
a hybrid silicon laser to generate a laser beam, the hybrid silicon laser including:
a first semiconductor region including layers of semiconductor materials from group III, group IV, or group V semiconductor to form an active region; and
a second semiconductor region forming a silicon waveguide and bonded to the first semiconductor region via direct bonding of a layer of the first semiconductor region to a layer of the second semiconductor region, wherein the layer of the first semiconductor region is composed of indium phosphide (InP), wherein the layer of the second semiconductor region is composed of silicon (Si), and wherein a surface of the layer of InP is directly bonded to a surface of the layer of Si;
a first electrical contact coupled to the active region of the first semiconductor region; and
a pair of second electrical contacts, coupled to the Si layer, of the second semiconductor region, wherein electric current flows from the first electrical contact to the pair of second electrical contacts through the Si layer, and wherein the layer of InP extends within a length of the active region.

10. The system of claim 9 further comprising a modulator coupled to the hybrid silicon laser and the optical waveguide, the modulator to modulate the laser beam transmitted over the optical waveguide.

11. The system of claim 10, wherein the receiver comprises a photo-detector to detect the modulated laser beam.

12. The system of claim 9, wherein the direct bonding between the layers of the first and second semiconductor regions is formed at room temperature in a vacuum.

13. The system of claim 9, wherein a surface of the layer of InP is directly bonded to a surface of the layer of Si via covalent bonding of the surfaces of the layers of InP and Si.

14. The system of claim 9,
wherein each of the second electrical contact is on either side of the active region.

15. The system of claim 9, wherein the silicon waveguide is configured to carry light generated from the active region of the first semiconductor region.

16. The system of claim 9, wherein the first and second semiconductor regions are devoid of any oxide layer between the layers of the first and second semiconductor regions that form a direct bond.

17. The system of claim 9, wherein the semiconductor material layers of the first semiconductor region comprises:
an ohmic contact layer coupled to a first electrical contact layer;
a cladding layer coupled to the ohmic contact layer;
a separated confinement hetero-structure (SCH) layer coupled to the cladding layer;
a carrier blocking layer coupled to the SCH layer;
a multiple quantum well (MQW) layer coupled to the SCH layer; and
an indium phosphide (InP) layer coupled to the MQW layer, wherein a surface of the InP layer is connected to a surface of a layer of the second semiconductor region via direct bonding.

18. The system of claim 9, wherein the second semiconductor region comprises a silicon-on-insulator (SOI) region.

* * * * *

UNITED STATES PATENT AND TRADEMARK OFFICE
CERTIFICATE OF CORRECTION

PATENT NO. : 8,620,164 B2
APPLICATION NO. : 13/010232
DATED : December 31, 2013
INVENTOR(S) : Heck et al.

Page 1 of 1

It is certified that error appears in the above-identified patent and that said Letters Patent is hereby corrected as shown below:

IN THE SPECIFICATION

Please insert in column 1, line 4 before FIELD OF INVENTION:

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*